United States Patent
Morimoto et al.

(10) Patent No.: US 9,209,001 B2
(45) Date of Patent: Dec. 8, 2015

(54) SPUTTERING APPARATUS AND SPUTTERING METHOD

(75) Inventors: Naoki Morimoto, Shizuoka (JP); Masahiko Ishida, Shizuoka (JP)

(73) Assignee: ULVAC, INC., Kanagawa (JP)

( * ) Notice: Subject to any disclaimer, the term of this patent is extended or adjusted under 35 U.S.C. 154(b) by 259 days.

(21) Appl. No.: 13/634,328

(22) PCT Filed: Mar. 16, 2011

(86) PCT No.: PCT/JP2011/001554
§ 371 (c)(1),
(2), (4) Date: Sep. 12, 2012

(87) PCT Pub. No.: WO2011/125292
PCT Pub. Date: Oct. 13, 2011

(65) Prior Publication Data
US 2013/0001075 A1    Jan. 3, 2013

(30) Foreign Application Priority Data

Apr. 2, 2010 (JP) .................................. 2010-086063

(51) Int. Cl.
| | |
|---|---|
| *C23C 14/34* | (2006.01) |
| *C23C 14/54* | (2006.01) |
| *C23C 14/50* | (2006.01) |
| *H01J 37/34* | (2006.01) |

(52) U.S. Cl.
CPC ............. *H01J 37/3438* (2013.01); *C23C 14/34* (2013.01); *C23C 14/345* (2013.01); *C23C 14/3492* (2013.01); *C23C 14/542* (2013.01); *C23C 14/50* (2013.01); *H01J 37/3405* (2013.01)

(58) Field of Classification Search
CPC ................ C23C 14/50; C23C 14/3435; C23C 16/4586; C23C 14/34; C23C 14/345; C23C 14/542; H01J 37/3438; H01J 37/3411; H01J 37/3405; H01L 21/687; H01L 21/68714; H01L 21/6833
USPC .................. 118/500, 728; 204/298.08, 298.15
See application file for complete search history.

(56) References Cited

U.S. PATENT DOCUMENTS

| | | | | |
|---|---|---|---|---|
| 5,542,559 | A * | 8/1996 | Kawakami et al. ............. | 216/67 |
| 6,478,924 | B1 * | 11/2002 | Shamouilian et al. ... | 156/345.48 |
| 6,706,155 | B2 * | 3/2004 | Morimoto et al. ........ | 204/192.12 |

FOREIGN PATENT DOCUMENTS

| | | |
|---|---|---|
| JP | 1-321136 A | 12/1989 |
| JP | 7-130827 A | 5/1995 |
| JP | 2002-080962 A | 3/2002 |

OTHER PUBLICATIONS

International Search Report for PCT Patent App. No. PCT/JP2011/001554 (Apr. 26, 2011).

*Primary Examiner* — Michael Band
(74) *Attorney, Agent, or Firm* — Cermak Nakajima & McGowan LLP; Tomoko Nakajima

(57) ABSTRACT

A sputtering apparatus includes: a vacuum chamber in which a target is to be disposed; a power supply to input power to the target; gas introduction device; exhaust device; and substrate holding device to hold a substrate to be processed. The substrate holding device includes: a chuck main body having positive and negative electrodes; a chuck plate having a rib portion capable of bringing a peripheral edge portion of the substrate into surface contact with the rib portion; and a multiplicity of supporting portions provided upright and arranged at predetermined intervals in an interior space surrounded by the rib portion; and a DC power supply to apply a direct voltage between the two electrodes. The sputtering apparatus suppresses a variation in film thickness among substrates.

3 Claims, 4 Drawing Sheets

(a)

(b)

(a)

(b)

SPUTTERING APPARATUS AND SPUTTERING METHOD

This application is a national phase entry under 35 U.S.C. §371 of PCT Patent Application No. PCT/JP2011/001554, filed on Mar. 16, 2011, which claims priority under 35 U.S.C. §119 to Japanese Patent Application No. 2010-086063, filed Apr. 2, 2010, both of which are incorporated by reference.

TECHNICAL FIELD

This invention relates to a sputtering apparatus and a sputtering method used to form a predetermined thin film on a substrate such as a glass or silicon wafer.

BACKGROUND ART

Semiconductor manufacturing processes include, in obtaining a desired device structure, a process of film deposition on a substrate to be processed, that is, a silicon wafer (hereinafter, referred to as "a wafer"), and such film deposition process conventionally uses a sputtering apparatus.

This sputtering apparatus produces plasma in such a way dial: a sputtering gas that is an inert gas such as argon is introduced into a vacuum chamber in a vacuum atmosphere; and a target formed depending on the composition of a thin film to be formed on a substrate surface is made to cause glow discharge by being supplied with a predetermined electric power from a DC power supply or high frequency power supply. Then, ions, such as argon ions, of the inert gas ionized in the plasma collide with the target, and thereby atoms and molecules of the target are ejected from the target. These sputtered panicles adhere to and are deposited on the substrate surface to form the film. In this case, the substrate to be processed is positioned and held by substrate loading means disposed at a position opposed to the target.

As the substrate holding means, there is a known one including: a chuck main body having positive and negative electrodes; a conductive chuck plate having a rib portion capable of bringing a peripheral edge portion of a substrate into surface contact with the rib portion, and multiple supporting portions provided upright and arranged at predetermined intervals in an interior space surrounded by the rib portion; and a DC power supply configured to apply a DC voltage between the two electrodes (see patent Document 1, for example).

In addition, as a sputtering apparatus to form a predetermined thin film at a high bottom coverage ratio (a ratio of a film deposition rate on the bottom surface of a hole with respect to a film deposition rate on a surface around the hole) for a fine hold with a high aspect ratio, there is a known one in which: a target made of a metallic material such as Cu, Ta or Ti is used; sputtered particles generated by sputtering are ionized in plasma; and the ions of the spattered particles are attracted to and made incident on the substrate by applying a high frequency bias voltage to the substrate (see Patent Document 2, for example).

Here, a sputtering apparatus including the aforementioned substrate holding means holds a substrate by passing a current through the positive and negative electrodes. For this reason, the substrate surface is charged with free electrons in plasma, and thereby the potential of the substrate surface is shifted to the negative side. Moreover, when the high frequency bias voltage is applied to the substrate, ions having heavier mass than electrons cannot respond to a quick change in the alternating electric field. As a result, the substrate surface is charged with the electrons and thereby the potential of the substrate surface is shifted to the negative side. When the potential of the substrate is shifted to the negative side, ions of the inert gas in the plasma are also attracted toward the substrate, and a so-called reverse sputtering occurs in which a substance adhered to and deposited on the substrate surface is sputtered. An amount of reverse sputtering is variable depending on an atmosphere in the vacuum chamber and a sputtering duration in the sputtering operation. In ease where film deposition is performed on substrates conveyed to a position opposed to a target, thin films are formed on the substrate surfaces by controlling sputtering conditions such as the input power supplied to the target, and the sputtering duration. Even in such controlled deposition, if an amount of reverse-sputtered, substance (hereinafter, referred to as a reverse-sputtered amount) is large, for example, the films cannot be deposited with a desired film thickness, which causes a problem that the film thickness and even the film quality in some cases vary among the substrates.

PRIOR ART DOCUMENTS

Patent Documents

Patent Document 1: Japanese Patent Application Publication No. Hei1-321136

Patent Document 2: Japanese Patent Application Publication No. 2002-80962

SUMMARY OF THE INVENTION

Problems to be Solved by the Invention

In view of the foregoing circumstances, it is an objective of this invention to provide a sputtering apparatus and a spattering method capable of suppressing variation in film thickness among substrates.

Means for Solving the Problems

In order to achieve the foregoing objective, a sputtering apparatus according to this invention is characterized in that the sputtering apparatus comprises: a vacuum chamber in which a target is to be disposed; a power supply to input power to the target; gas introduction means for introducing a predetermined sputtering gas into the vacuum chamber; exhaust means for evacuating the vacuum chamber; and substrate holding means for holding a substrate to be processed in the vacuum chamber. The substrate holding means comprises: a chuck main body including positive and negative electrodes; a dielectric chuck plate having a rib portion capable of bringing a peripheral edge portion of the substrate into surface contact with the rib portion, and a plurality of supporting portions provided upright and arranged at predetermined distances from one another in an interior space surrounded by the rib portion; a DC power supply to apply a direct voltage between the positive and negative electrodes; an AC power supply to pass an alternating current through an electrostatic capacitance of the chuck plate; and measurement means for measuring the alternating current passing through the electrostatic capacitance of the chuck plate. The sputtering apparatus further comprises control means for controlling a pressure inside the vacuum chamber so as to maintain the alternating current value measured by the measurement means at a predetermined value, when a predetermined thin film is formed on a surface of the substrate by sputtering the target while introducing a predetermined gas into the vacuum chamber with the gas introduction means.

According to this invention, the vacuum chamber is evacuated after the substrate is held with the direct voltage being applied to the positive and negative electrodes of the substrate holding means. When the pressure inside the vacuum chamber reaches a predetermined value, film deposition is performed on the substrate held by the substrate holding means by sputtering the target with the predetermined gas introduced via the gas introduction means and with, the power inputted to the target. During sputtering, the substrate surface is charged with electrons, and the potential of the substrate surface is shifted to the negative side. With such potential shift, ions of the sputtering gas in plasma are attracted toward the substrate and a substance adhered to and deposited onto the substrate surface census to be reversely sputtered.

In this respect, the inventors of this invention made intensive studies and found out that the potential of the substrate surface during sputtering depends on the pressure inside the vacuum chamber (the partial pressure of the inert gas). Moreover, the inventors also found out that: since an input energy acting when the ions of the sputtering gas in the plasma are attracted to the substrate is shown up as a change in an alternating current passing through the electrostatic capacitance of the chuck plate, and therefore as a change in an impedance, the impedance depends on the pressure inside the vacuum chamber and that; the impedance and the potential of the substrate surface correlate with each other. In this ease, for example, as the impedance becomes lower, the reverse-sputtered amount increases.

On the basis of the above findings, in this invention, the measurement means measures the value of the alternating current passing through the electrostatic capacitance of the chuck plate (the impedance value), and the pressure inside the vacuum chamber (the partial pressure of the inert gas) is controlled based on the measured value, thereby enabling die control of the reverse-sputtered amount. With this arrangement, when film deposition is performed with substrates conveyed to a position opposed to the target, variations in film thickness and even film quality in some cases among the substrates can be suppressed by controlling the pressure inside the vacuum chamber (the sputtering gas introduction rate) based on the impedance. It should be noted that, if the sputtering gas introduction rate (the pressure inside the vacuum, chamber) is changed while the input power to the target is fixed, the amount of sputtering of the target may also change. However, a change in the reverse-sputtered amount has larger influence on the film deposition rate on the substrate surface than a change in the amount of the sputtering of the target. For this reason, by keeping the reverse-sputtered amount constant, variations in film thickness and film quality among substrates can be reduced to a minimum.

Also in this invention, the control means controls the pressure inside the vacuum chamber by increasing or decreasing a gas introduction rate of the gas introduction means or an exhaust rate of the exhaust means.

On the other hand, there is a case where film deposition is performed in such a way that bias power is inputted to a substrate thereby making ions of the sputtered particles attracted and incident onto the substrate during film deposition by sputtering. In this case, it is found out that an increase or decrease in the bias power thus inputted causes a change in the reverse-sputtered amount and thereby causes a change in the film deposition rate, and that the bias power correlates with the impedance value. More specifically, as the impedance becomes lower, for example, the film deposition rate on the substrate surface becomes higher. In view of this, this invention preferably further includes a bias power supply to input bias power to the substrate held by the substrate holding means. The control means preferentially controls the bias power so as to maintain the alternating current value measured by the measurement means at a predetermined value, when a predetermined thin film is formed on a surface of the substrate by sputtering the target while introducing a predetermined gas into the vacuum chamber with the gas introduction means and by applying a bias voltage to the substrate. With this arrangement, variations in film thickness and even film quality in some cases among substrates can be suppressed.

MODES FOR CARRYING OUT THE INVENTION

Figure 1:
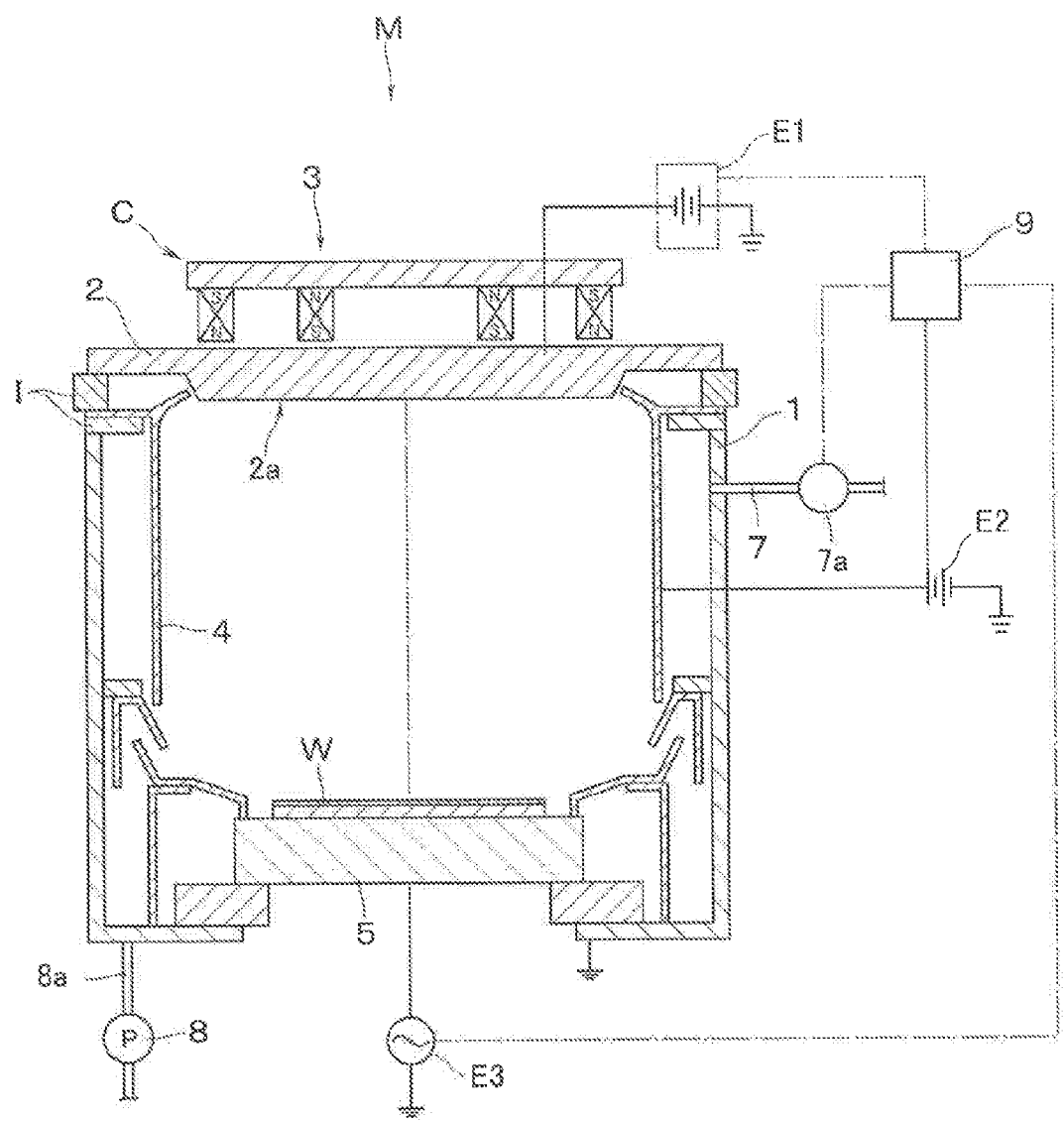
FIG. 1 is an explanatory diagram of a sputtering apparatus according to an embodiment of this invention.
Figure 2:
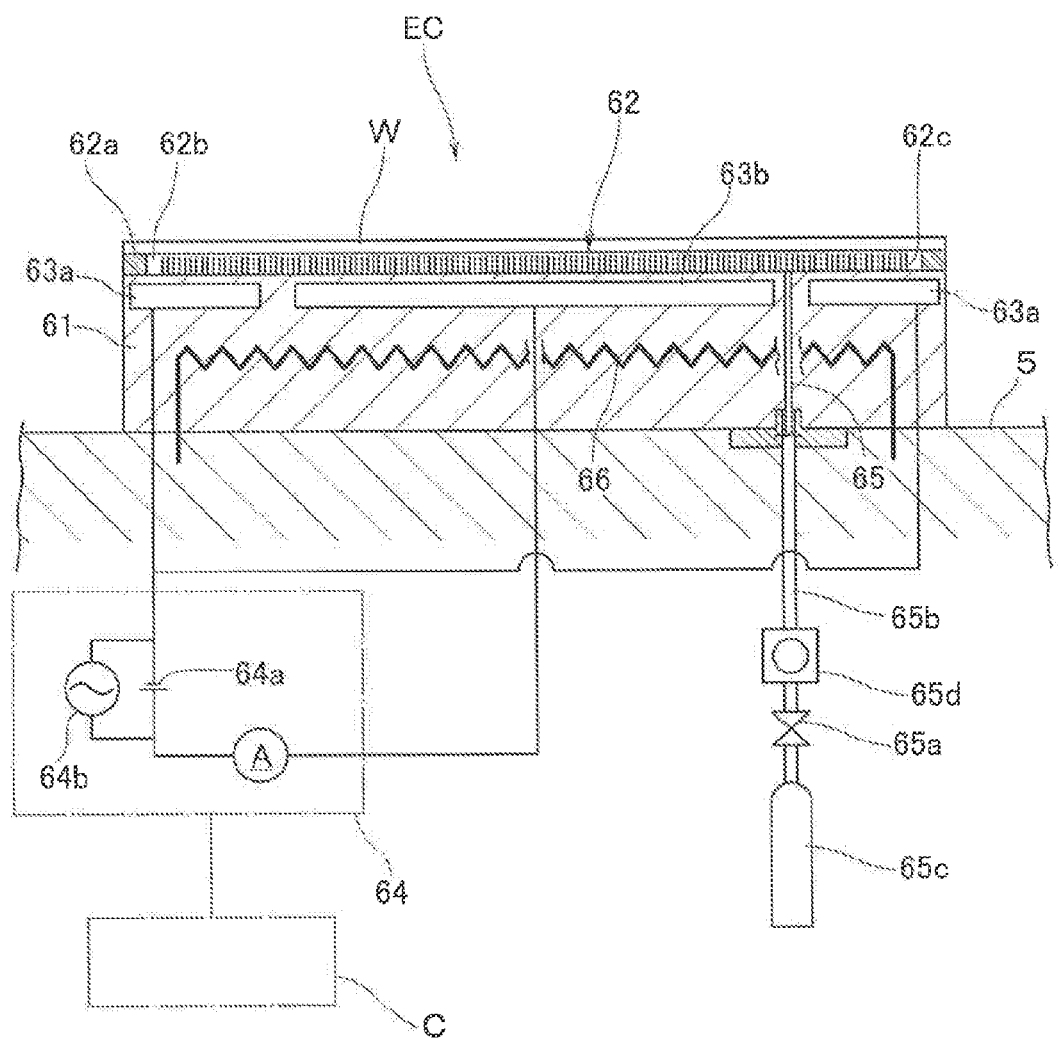
FIG. 2 is an explanatory diagram of an enlarged view of a substrate holding device used for a sputtering apparatus illustrated in FIG. 1.

Hereinafter, assuming that a substrate to be processed is a wafer W, a sputtering apparatus most suitable to form a thin film made of Cu, Ti, Ta, or fire like on a surface of fee wafer W according to an embodiment of this invention will be described with reference to the accompanying drawings. As illustrated in FIG. 1, a sputtering apparatus M includes a vacuum chamber 1 capable of creating a vacuum atmosphere, and a cathode unit C is attached to a ceiling portion of the vacuum chamber 1. The following description is provided assuming that a direction toward the ceiling portion of the vacuum chamber 1 is "upward," whereas a direction toward a bottom portion of the vacuum chamber 1 is "downward".

The cathode unit C Includes a target 2 and a magnet unit 3 placed on an upper side of the target 2. The target 2 is made of a material, for example, Cu, Ti, or Ta, selected as needed, depending on the composition of a thin film to be formed on the wafer W to be processed, and is formed into a circular or rectangular shape in a plan view by a well know method. Then, the target 2 set in a backing plate (not illustrated) is attached to the vacuum chamber 1 with an insulator 1 interposed in between.

The magnet unit 3 is arranged to generate a magnetic field in a space below a sputtering surface (a surface to be sputtered) 2a, and efficiently ionize sputtered particles ejected from the target 2 during sputtering by capturing free electrons and the like below the sputtering surface 2a. Since well known units in various forms are usable as the magnet unit 3, the detailed description thereof is omitted herein. The target 2 is connected to a DC power supply E1 serving as a sputtering power supply, and a negative direct potential is applied to the target 2 during sputtering. Note that the sputtering power supply is not limited to the foregoing one, but a high frequency power supply or the like may be used.

A conductive anode shield 4 is placed in the vacuum, chamber 1. The anode shield 4 is a tubular member surrounding the periphery of the target 2 and extending downward. In this ease, another DC power supply E2 may be connected to the anode shield 4, and may apply a positive direct potential to the anode shield 4 during sputtering, in this arrangement, the anode shield 4 reflects ions of the ionized sputtered particles and thereby can assist the ions to be emitted to the substrate W with high straightness.

A stage 5 is placed in the bottom portion of the vacuum chamber 1 so as to be opposed to the cathode unit C. A substrate holding device EC is provided on top of the stage 5. As illustrated in FIG. 25 the substrate holding device EC is a so-called electrostatic chuck, and includes a chuck main body 61 placed on top of the stage 5 and a dielectric chuck plate 62 provided on an upper surface of the chuck main body 61. The chuck main body 61 is made of aluminum nitride, for example, and has positive and negative electrodes 63a, 63b incorporated therein with an insulating layer (not illustrated) interposed, in between. A direct voltage is applied between the two electrodes 63a, 63b from a DC power supply 64a in a power supply circuit 64.

In addition, a gas passage 65 passing through the chuck main body 61 vertically is formed in the chuck main body 61. A lower end of the gas passage 65 communicates with a gas source 65e through a gas pipe 65b in which an APC (automatic pressure controller) 65a is provided. The gas source 65c contains an assist gas made of an inert gas. In this case, a well known mass flow meter 65d is provided downstream of the APC 65a, and thereby a gas flow rate can be monitored. Moreover, a heater 66 of a resistively-heating type is also incorporated in the chuck main body 61, and the wafer W can be held in a state heated to a predetermined temperature. Note that the chuck main body 61 may be provided with a cooling passage therein and be arranged to cool, the wafer w by circulating a coolant therein. On the other hand, the chuck plate 62 is made of aluminum nitride, for example, and includes an annular rib portion 62a capable of bringing a peripheral edge portion of the back surface of the wafer W into surface contact with the rib portion, and multiple rod-like supporting portions 62c provided upright and arranged concentrically in an interior space 62b surrounded by the rib portion 62a.

After the wafer W is mounted on the chuck plate 62, the wafer W is clamped on the surface of the chuck plate 62 by an electrostatic force generated by application of a direct voltage across the two electrodes 63a, 63b via the DC power supply 64a. At this time, the entire peripheral edge portion of the back surface of the wafer W comes into surface contact with the rib portion 62a, and thereby the interior space 62b is sealed substantially hermetically (in this case, the wafer W turns into a state substantially parallel to the surface of the chuck plate 62). When gas supply means supplies the assist gas to the interior space 62b in this state, a gas atmosphere is created in the interior space 62b. In this way, the gas atmosphere created in the interior space 62b defined by the rib portion 62a and the back surface of the wafer W assists heat transfer to the wafer W, and enables efficient heating or cooling.

In the power supply circuit 64 for chuck, an AC power supply 64b is connected in parallel to the DC power supply 64a, and passes an alternating current through the electrostatic capacitance of the electrostatic chuck. Thus, an impedance value can be monitored from a current value measured by an ammeter A. In this case, the ammeter A constitutes measurement means of this embodiment. Then, when the wafer W is clamped on the surface of the chuck plate 62 as described above, the wafer W is controlled as follows. Specifically, the impedance value and the gas flow rate under the condition in which the wafer W is substantially parallel to the surface of the chuck plate 62 are acquired in advance. If at least one of the impedance value and the gas flow rate varies beyond a predetermined range on the occasion of newly clamping a wafer or during sputtering film deposition, the force for clamping the wafer W is changed by changing the clamping voltage from the DC power supply 64a. Under such control, the wafer W is positioned substantially parallel to the surface of the chuck plate 62, in other words, a distance between the upper surface of the chuck main body 61 and the back surface of the wafer W is made even in a whole area. In this embodiment, a load lock chamber, which is not particularly explained with illustration, is connected to the vacuum chamber via a gate valve, for example. Thus, the sputtering apparatus is made capable of conveying substrates one after another to the stage 5 in the vacuum atmosphere.

In addition, a gas pipe 7 for introducing the sputtering gas of an inert gas such as argon is connected to a side wall of the vacuum chamber 1. This gas pipe 7 communicates with a gas source (not illustrated) through a mass flow controller 7a. These components constitute gas introduction means, and are capable of introducing the sputtering gas into the vacuum chamber 1 at a controlled flow rate. Moreover, an exhaust pipe 8a is connected to the bottom portion of the vacuum chamber 1. The exhaust pipe 8a extends and communicates with a vacuum exhaust device 8 including a turbo molecular pump, a rotary pump and the like. A high frequency power supply E3 is connected to the stage 5. During sputtering, the high frequency power supply E3 applies a bias potential to the stage 5, and consequently to the substrate W, thereby making the substrate W actively attract ions of sputtered particles, in particular.

The aforementioned sputtering apparatus M includes control means 9 having a microcomputer, a memory, a sequencer and the like. The control means 9 performs overall control of operations of the above power supplies E1 to E3, operations of the above mass flow controller 7a for sputtering gas introduction, operations of the above vacuum exhaust device 8, and the like. In addition, the control means 9 also performs overall control of operations of each of the power supplies 64a, 64b of the substrate holding means EC and operations of the APC 65a, and stores therein the impedance value and the gas flow rate under the condition in which the wafer W is substantially parallel to the surface of the chuck plate 62.

Here, when film deposition is performed by sputtering with the wafer clamped by the substrate holding means EC of the sputtering apparatus M, the substrate surface is charged with the free electrons in the plasma and thereby the potential of the substrate surface is shifted to the negative side. Moreover, when the nigh frequency bias voltage is applied to the wafer W via the power supply E3 during film deposition ions having heavier mass than electrons cannot respond to a quick change in the alternating electric field. As a result, the substrate surface is charged with electrons and thereby the potential of the substrate surface is shifted to the negative side. In this case, the ions of the sputtering gas in the plasma are also attracted toward the wafer W, and the substance adhered to and deposited on the substrate surface is reverse-sputtered. The reverse-sputtered, amount is variable depending on an atmosphere in the vacuum chamber and a duration in the sputtering operation. For this reason, when film deposition is performed with wafers W conveyed one after another to the stage 5, it is necessary to prevent the film, thickness and also the film quality in some cases from varying among the wafers W.

In this respect, the inventors of this invention made an experiment as follows. Specifically, in the foregoing sputtering apparatus M, Cu films were formed on silicon substrates by using one made of Cu as the target and using an argon gas as the sputtering gas. As for the sputtering conditions, the input power to the target was set to 5 kW, and the sputtering duration was set to 60 seconds. In addition, the direct voltage applied between the two electrodes 3a, 3b by the DC power supply 64a was set to 0.8 kV. As a result of determination of the impedance value based on the alternating current value from the ammeter A, the impedance value was approximately 17.5 kΩ. Then, a sputtering gas introduction rate during the film deposition was changed within a range of 8 to 40 sccm by controlling the mass flow controller 7a as needed, and measurement was made on a change in the impedance value and the potential of the substrate surface (which was measured, by a probe inserted inside the vacuum chamber).

Figure 3:
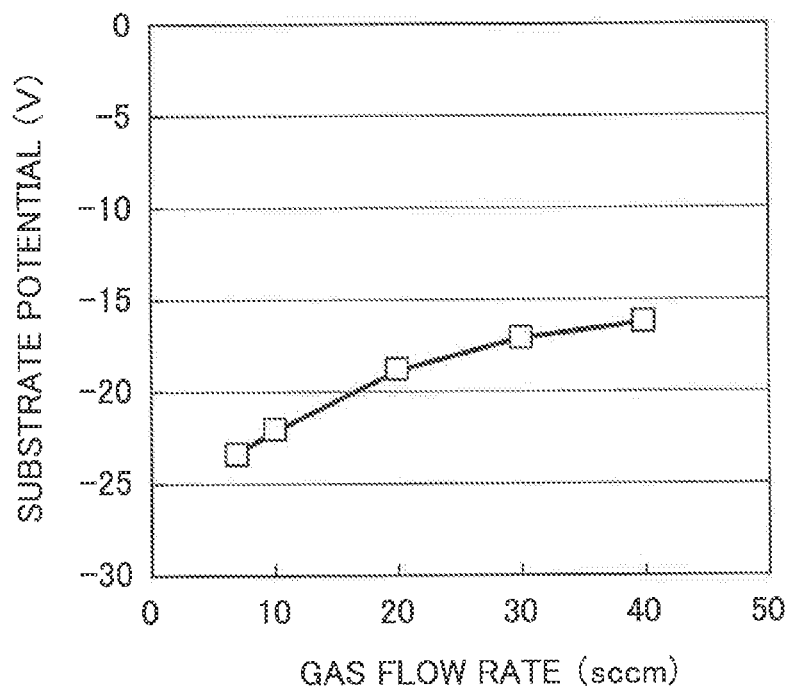
FIGS. 3(a) and 3(b) are graphs for explaining relationships of a gas flow rate with an impedance and a substrate potential.
Figure 3:
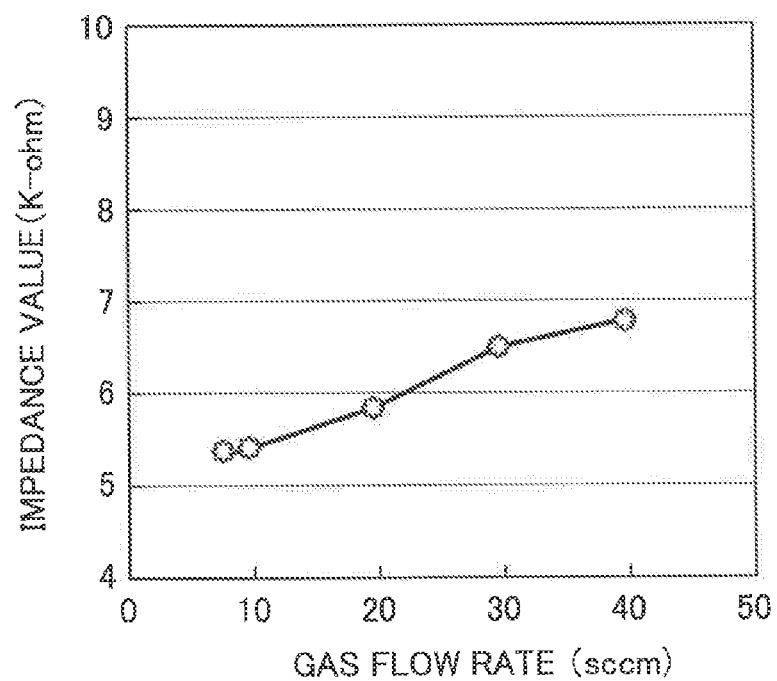

FIG. 3(a) and FIG. 3(b) are graphs indicating relationships of the sputtering gas introduction rate with the impedance value and the potential of the substrate surface. From these graphs, it is apparent that as the gas introduction rate during sputtering is increased, the substrate potential, increases (see FIG. 3(a)) and the impedance value also increases (see FIG. 3(b)). Moreover, the substrate potential and the impedance value which vary with an increase or decrease in the gas introduction rate (a pressure inside the vacuum chamber during film deposition) obviously correlate to each other. In this case, as a result of measurement of the film thicknesses of the Cu films formed on the substrate surfaces, it was confirmed that as the impedance value becomes lower, the film thickness of the Cu film, becomes smaller and accordingly the reverse-sputtered amount increases.

Subsequently, in the foregoing sputtering apparatus M, the sputtering gas was introduced at 7 seem into the vacuum chamber 1. Thereafter, the introduction of the sputtering gas was stopped, and a Cu film was formed on a wafer W through self-sustained, discharge of Cu. As the sputtering conditions, the input power to the target was set to 18 kW, and the spattering duration was set to 60 seconds. Then, an experiment was made in which a predetermined bias power was applied to the wafer W by the power supply E3 during sputtering film, deposition.

Figure 4:
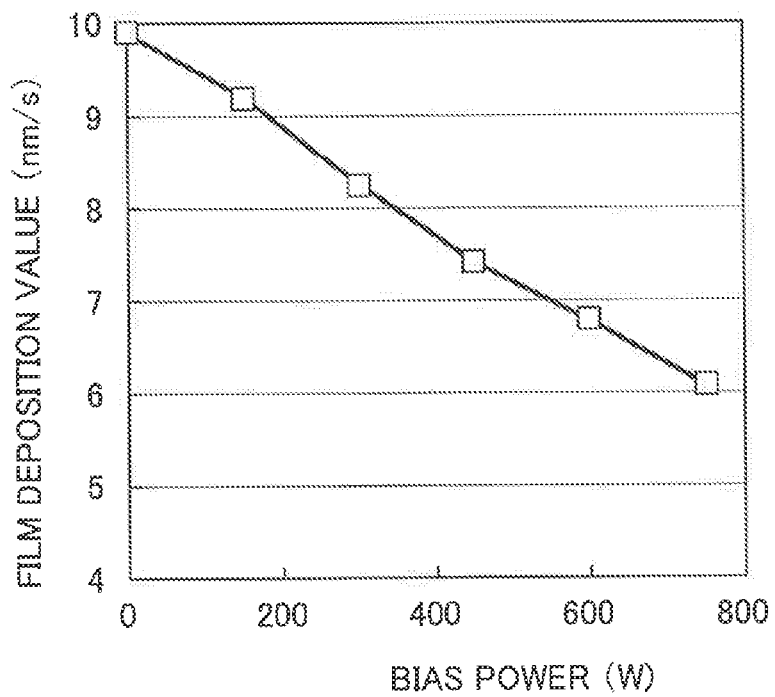
FIGS. 4(a) and 4(b) are graphs for explaining relationships of a bias power with an impedance and a film deposition rate.
Figure 4:
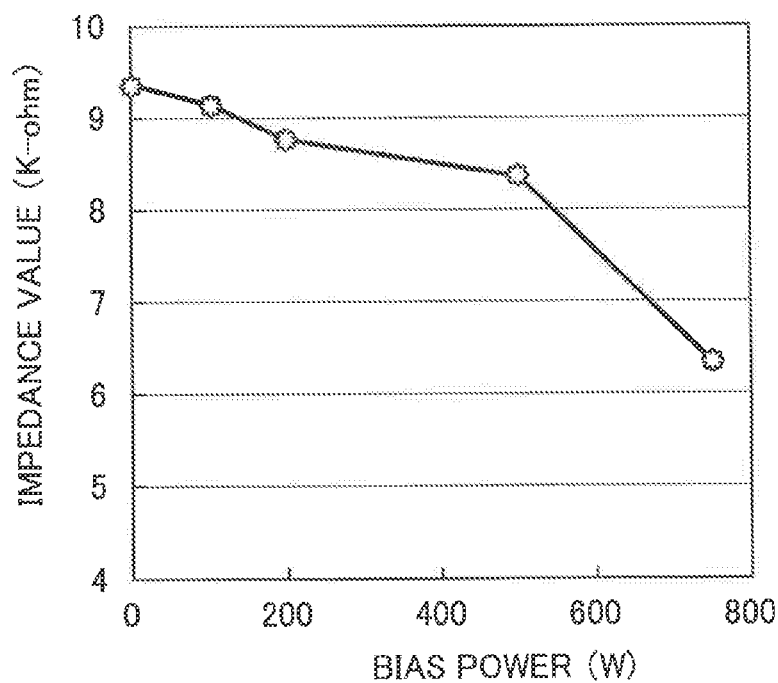

FIG. 4(a) and FIG. 4(b) are graphs indicating a bias power and changes in a film deposition rate (calculated from the film thickness of the Cu film) of the Cu film formed on the substrate surface, and the impedance value under the conditions in which the bias power was changed within a range up to 800 W. From these graphs, it is apparent that as the bias voltage is increased, the film deposition rate decreases (see FIG. 4(a)) and the impedance value also decreases (see FIG. 4(b)). Moreover, it is apparent dial the film deposition rate and the impedance value which vary with an increase or decrease in the bias power obviously are correlated with each other in this case, it was confirmed that as the impedance value becomes lower, the reverse-sputtered amount increases and accordingly the film deposition rate decreases.

In view of the above results, in case where sputtering film deposition is performed by introducing die sputtering gas by the gas introduction means 7, 7a and by inputting the power only to the target 2 without inputting the bias power to the wafer W, this embodiment is carried out as follows. In the film deposition (including in the course of film deposition), the control, means 9 controls die gas introduction rate via the mass flow controller 7a and thereby controls the pressure inside the vacuum chamber (the partial pressure of the sputtering gas) so that the impedance can be kept at a predetermined, value. Hereinbelow, the sputtering film deposition according to this embodiment will be described.

To be more specific, a wafer W on which a film is to be deposited is conveyed to the substrate holding means EC in the vacuum chamber 1 in the vacuum atmosphere, and is mourned thereon in a position-aligned state. Then, the wafer W is damped on the surface of the chuck plate 62 by the electrostatic force generated, with application of the direct voltage between the two electrodes 63a, 63b via the DC power supply 64a. In this state, the AC power supply 64b passes the alternating current through the electrostatic capacitance of the electrostatic chuck. The alternating current value measured by the ammeter A when the alternating current passes through the electrostatic capacitance is outputted to the control means 9, and the control means 9 obtains the impedance value. Then, the control means 9 compares the obtained impedance value with the setting impedance value, which is stored in the control means 9 in advance, under the condition in which the wafer W is substantially parallel to the surface of the chuck plate 62, and sets the clamping voltage front the DC power supply 64a such that the obtained impedance value can be within a predetermined, range. In this way, the wafer W is held in a state substantially parallel to the surface of the chuck plate 62.

Subsequently, the sputtering gas is introduced by the gas introduction means 7, 7a, and tire power is inputted only to the target 2 while no bias power is inputted to the wafer W. At this time, the control means 9 remains obtaining the impedance value by using the ammeter A. In this respect, the control means 9 stores the relationship between the impedance value and the sputtering gas introduction rate under the condition in which the input voltage to the target 2 is fixed. When the obtained impedance value is above or below the predetermined range, the control means 9 controls the mass flow controller 7a to change die gas flow rate. More specifically, if the obtained impedance falls below the predetermined range, for example, the control means 9 judges that the potential of the wafer W is so low (shifted to the minus side) that the reverse-sputtered amount will be large. In this case, the control means 9 increases the gas introduction rate to reduce the reverse-sputtered amount.

In this way, by keeping the reverse-sputtered amount constant, variations in film thickness and also film quality in some cases among the wafers W can be reduced to a minimum. In this case, with the impedance value kept constant, the substrate is clamped substantially horizontal, and sputtered particles from the target 2 reach the wafer W substantially evenly over the entire surface. Thus, the thin film on the surface of each wafer W can have high in-plane uniformity in a film thickness distribution thereof and variations in the in-plane uniformity in the film thickness distribution among the substrates can be also reduced.

On the other hand, in case where the high frequency power is inputted to the wafer W via the power supply E3, the control means 9 stores a relationship between the impedance value and the bias voltage in advance, and preferentially controls the bias power if the obtained impedance value is above or below the predetermined range. More specifically, when the impedance value is low, an increase in the reverse-sputtered amount lowers the film deposition rate, and accordingly the control means 9 lowers the bias voltage. In this way, variations in the film thickness and also film quality in some cases among the wafers W can be reduced to a minimum as in the ease described above.

Hereinabove, the sputtering apparatus M according to the embodiment of this invention has been described, but this invention is not limited to the one described above. This invention is applicable to any type of sputtering apparatus as long as the apparatus can perform sputtering film deposition while holding a substrate by substrate holding means, that is, a so-called electrostatic chuck. Moreover, the above embodiment has been described by taking as an example the one configured to change the gas introduction rate depending on the impedance value to control the pressure inside the vacuum chamber, but this invention is not limited to tins. For example, a conductance valve can be provided to the exhaust pipe 8a communicating the vacuum exhaust device 8, and the pressure inside the vacuum chamber can be controlled by controlling the conductance valve.

Furthermore, in this invention, the correlation between the substrate potential and the impedance value that vary with an increase or decrease in the gas introduction rate (the pressure inside the vacuum chamber during film deposition) and the correlation between the film deposition rate and the impedance value which vary with an increase or decrease in the bias power can be used in an etching apparatus and thereby can be applied to the control of the etching rate.

EXPLANATION OF REFERENCE NUMERALS

M . . . sputtering apparatus, 1 . . . vacuum chamber, 2 . . . target 7, 7a . . . gas introduction means, 8 . . . vacuum exhaust device, EC . . . substrate holding device (electrostatic chuck), 61 . . . chuck main body, 62 . . . chuck plate, 62a . . . rib portion, 62b . . . interior space, 62c . . . supporting portion, 63a, 63b . . . (positive and negative) electrodes, C . . . control means, E1 to E3 . . . power supply, 64 . . . power supply circuit for chuck, 64a . . . DC power supply, 64b . . . AC power supply, A . . . ammeter, W . . . wafer (substrate).

The invention claimed is:

1. A sputtering apparatus comprising:
a vacuum chamber in which a target is to be disposed;
a power supply to input power to the target;
a gas pipe provided with a mass flow meter, the gas pipe configured to introduce a predetermined sputtering gas into the vacuum chamber;
a vacuum exhaust device configured to evacuate the vacuum chamber; and
a substrate holding device holding a substrate to be processed in the vacuum chamber, the substrate holding device including:
a chuck main body including positive and negative electrodes, where the positive and negative electrodes are arranged in a same plane;
a dielectric chuck plate having a rib portion capable of bringing a peripheral edge portion of the substrate into surface contact with the rib portion, and a plurality of supporting portions provided upright and arranged at predetermined distances from one another in an interior space surrounded by the rib portion;
a DC power supply to apply a direct voltage between the positive and negative electrodes;
an AC power supply directly connected to the positive and negative electrodes to output and pass an alternating current through an electrostatic capacitance of the chuck plate; and
an ammeter configured to measure the alternating current passing through the electrostatic capacitance of the chuck plate, and an impedance based on the alternating current passing through the electrostatic capacitance,
the sputtering apparatus further including a controller connected to both the ammeter and the mass flow meter, the controller programmed to:
store a predetermined range of a relationship between an impedance value based on the alternating current and the sputtering gas introduction rate under a condition in which an input voltage to the target is fixed, where the controller obtains the impedance from the ammeter to control a pressure inside the vacuum chamber at a predetermined value during sputtering of the target, and based on the impedance controlling the mass flow meter to control the pressure by:
increasing an amount of the predetermined sputtering gas into the vacuum chamber when the impedance is lower than the predetermined range, and
decreasing the amount of the predetermined sputtering gas into the vacuum chamber when the impedance is higher than the predetermined range.

2. The sputtering apparatus according to claim 1, wherein the controller controls the pressure inside the vacuum chamber by increasing or decreasing a gas introduction rate of the gas pipe or an exhaust rate of the vacuum exhaust device.

3. The sputtering apparatus according to claim 1, further comprising a bias power supply to input bias power to the substrate held by the substrate holding device,
wherein the controller controls the bias power so as to maintain the alternating current measured by ammeter at a predetermined value, when a predetermined thin film is formed on the surface of the substrate by sputtering the target while introducing the predetermined sputtering gas into the vacuum chamber with the gas introduction means and by applying a bias voltage to the substrate.

* * * * *